United States Patent
Ye et al.

(10) Patent No.: US 8,500,963 B2
(45) Date of Patent: Aug. 6, 2013

(54) SPUTTERING OF THERMALLY RESISTIVE MATERIALS INCLUDING METAL CHALCOGENIDES

(75) Inventors: Mengqi Ye, San Jose, CA (US); Keith A. Miller, Sunnyvale, CA (US); Peijun Ding, Saratoga, CA (US); Goichi Yoshidome, Emeryville, CA (US); Rong Tao, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1806 days.

(21) Appl. No.: 11/778,648

(22) Filed: Jul. 17, 2007

(65) Prior Publication Data

US 2008/0099326 A1     May 1, 2008

Related U.S. Application Data

(60) Provisional application No. 60/863,044, filed on Oct. 26, 2006.

(51) Int. Cl.
    *C23C 14/35*         (2006.01)
(52) U.S. Cl.
    USPC ............ 204/192.15; 204/192.12; 204/192.17; 204/192.25
(58) Field of Classification Search
    USPC ............. 204/192.12, 192.15, 192.17, 192.25
    See application file for complete search history.

(56) References Cited

U.S. PATENT DOCUMENTS

| | | | | |
|---|---|---|---|---|
| 3,716,844 | A | * | 2/1973 | Brodsky ..................... 430/346 |
| 4,771,730 | A | * | 9/1988 | Tezuka ...................... 118/723 E |
| 4,933,063 | A | * | 6/1990 | Katsura et al. ............ 204/298.03 |
| 5,166,758 | A | * | 11/1992 | Ovshinsky et al. ............... 257/3 |
| 5,744,016 | A | * | 4/1998 | Yamada et al. .......... 204/298.11 |
| 5,810,982 | A | * | 9/1998 | Sellers ..................... 204/298.08 |
| 5,825,046 | A | * | 10/1998 | Czubatyj et al. ................. 257/2 |
| 7,186,319 | B2 | | 3/2007 | Yang et al. ............... 204/192.12 |
| 2004/0094402 | A1 | * | 5/2004 | Gopalraja et al. ........ 204/192.12 |
| 2005/0103621 | A1 | * | 5/2005 | Li et al. .................... 204/192.15 |
| 2005/0211548 | A1 | * | 9/2005 | Gung et al. .............. 204/192.12 |

OTHER PUBLICATIONS

Chao-Te Lie et al, $Ge_2Sb_2Te_5$ Thin Film Doped with Silver, *Jpn. J. Appl. Phys.*, vol. 42, Feb. 2003, 1026-1028 pp.
E. Morales-Sanchez et al., Determination of the glass transition and nucleation temperatures in $Ge_2Sb_2Te_5$ sputtered films, *Journal of Applied Physics*, vol. 91, No. 2, Jan. 2002, 697-702.

* cited by examiner

*Primary Examiner* — Rodney McDonald
(74) *Attorney, Agent, or Firm* — Charles S. Guenzer (57) ABSTRACT

A plasma sputtering method for metal chalcogenides, such as germanium antimony telluride (GST), useful in forming phase-change memories. The substrate is held at a selected temperature at which the material deposits in either an amorphous or crystalline form. GST has a low-temperature amorphous range and a high-temperature crystalline range separated by a transition band of 105-120° C. Bipolar pulsed sputtering with less than 50% positive pulses of less than 10:s pulse width cleans the target while maintain the sputtering plasma. The temperature of chamber shields is maintained at a temperature favoring crystalline deposition or they may be coated with arc-spray aluminum or with crystallographically aligned copper or aluminum.

17 Claims, 7 Drawing Sheets

SPUTTERING OF THERMALLY RESISTIVE MATERIALS INCLUDING METAL CHALCOGENIDES

FIELD OF THE INVENTION

The invention relates generally to sputtering of materials. In particular, the invention relates to metal chalcogenides.

BACKGROUND ART

Sputtering, alternatively called physical vapor deposition (PVD), is the most prevalent method of depositing layers of metals and related materials in the fabrication of semiconductor integrated circuits. The most commonly practiced form of sputtering is DC magnetron sputtering in which a negative DC voltage is applied to a metallic target in opposition to a grounded chamber shield. A magnetron positioned in back of the target projects a magnetic field adjacent the front face of the biased target to create a high-density plasma of a sputter working gas such as argon. The argon ions of the plasma efficiently sputter metal atoms from the target.

Much of modern sputtering is based on ionizing a large fraction of the sputtered atoms. A high ionization fraction may be accomplished by a small strong magnetron, which intensifies the plasma density and strongly concentrates in area near the magnetron, and by increasing the target power to the 10 kW range and above. DC magnetron sputtering typically generates much heat in the target and high target power further increases the heat. Accordingly, it is standard practice in plasma sputtering to water cool the target. Typically for wafer processing, a cooling bath of chilled water is contained at the back of the target, which requires the magnetron to be placed in the bath. The most commonly used metal targets of aluminum, copper, and even refractory metals such as titanium and tantalum readily conduct the heat generated by the plasma on the front face of the target to the cooling water at the back.

Recently, however, interest has developed in sputtering less conductive metals, metal alloys, metal nitrides, and metal oxides, and semiconductor or related materials including $Ge_xSb_yTe_z$ (germanium antimony telluride or GST). An example of GST is $Ge_2Sb_2Te_5$ used for non-volatile phase-change memory (PCM). Targets of GST are subject to a strict thermal budget. GST is a metal chalcogenide which is sometimes characterized as a semi-metal rather than a semiconductor. The chalcogen tellurium is in Group VI, as are the chalcogens sulfur and selenium, while germanium and antimony are Group IV and V, the former being an elemental semiconductor and the latter often part of a semiconductor III-V compound. The Groups IV and V components will be considered as metals. A notable property of such metal chalcogenide materials is a possible thermally induced phase change between a resistive amorphous state and a conductive polycrystalline state. The phase change can be induced or written by pulsing current through a GST cell to raise it above a transition temperature. Depending on whether the cell is quickly or slowly quenched to a lower temperature below the transition temperature, the cell upon cooling remains in a resistive amorphous state or changes to a conductive polycrystalline state depending upon the details of the degree of heating and the rapidity of cooling. The memory state can then be read electrically by effectively measuring the resistance of the cell.

Metal nitrides are typically moderately electrically conductive and electrically conductive metal oxides are known which can be used for electrodes.

Although even dielectric materials may be RF sputtered, DC magnetron sputtering is preferred for its speed and low equipment cost and the advanced development of DC magnetron sputtering. Low electrical conductivity is generally though not universally associated with low thermal conductivity according to the Wiedemann-Franz law, which is generally applied to metals but not oxides or nitrides. In general, materials other than highly conductive metals poorly conduct heat and thus are subject to excessive heating in conventional sputtering, which may lead to target degradation including cracking. Non-catastrophic effects include a strong temperature profile across the target, which may degrade sputtering uniformity.

SUMMARY OF THE INVENTION

A metal chalcogenide, such as germanium antimony telluride (GST), is sputter deposited at a controlled temperature such that the deposited film is deposited in either its crystalline or amorphous form. GST and other metal chalcogenides are useful in phase-change memories in which the cell can be switched between a resistive amorphous state and a more conductive crystalline state.

For germanium antimony telluride, low deposition temperatures, for example, below 105° C. or 115° C. depending upon other deposition conditions, favor the amorphous state and high deposition temperatures above 105° C. or even 100° C. depending upon other deposition conditions favor the crystalline state. Preferred crystalline deposition temperatures are above 140 or 235° C. and below 350° C. Preferred amorphous deposition temperatures are less than 25° C. and above 0° C.

Metal chalcogenide targets are preferably sputtered with a bipolar pulse form in which a reversed positive voltage is applied to the target with a duty cycle of less than 50% and with a repetition rate of 10 to 200 kHz while the longer negative pulse effects sputtering of the target. Exemplary values are positive pulse widths of 3 microseconds and a 25 to 100 kHz pulse rate. A pulse width of less than about 10 microseconds allows the sputtering plasma to be sustained during the positive pulse. The reversed pulsing is useful in cleaning the target and reducing the thermal load in view of the low thermal conductivity and granular multi-component composition of metal chalcogenide targets.

Chamber shields are preferred on which the metal chalcogenide does not deposit in its amorphous form. Several means are available to prevent such deposition. The shields may be fitted with resistive or radiant heaters or with liquid cooling coils. They may be pre-coated with a layer of arc-sprayed aluminum having a rough surface or with a layer or polycrystalline aluminum or copper promoting crystalline deposition of the metal chalcogenide.

DETAILED DESCRIPTION OF THE PREFERRED EMBODIMENTS

Figure 1:
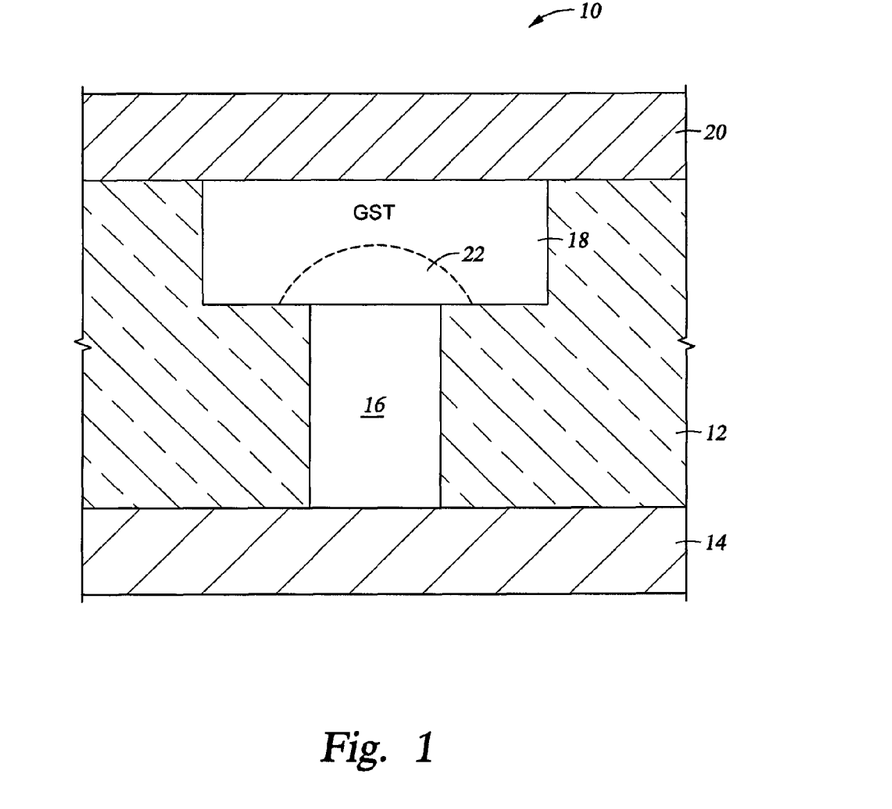
FIG. 1 is a cross-sectional view of a phase-change memory cell to which the invention may be applied.

An example of a phase-change memory (PCM) cell 10 is illustrated in the cross-sectional view of FIG. 1 although the invention is not limited to such a structure. A dielectric layer 12, for example, of silicon oxide, is grown over a bottom electrode 14. A vertical structure is etched through the dielectric layer 12. A via 16 in the lower portion is filled with a metal to contact the bottom electrode 14. A wider plug 18 at the top of the dielectric layer 16 and contacting and overhanging the via 16 is filled with a phase-change material, such as the metal chalcogenide germanium antimony telluride (GST). A top electrode is 20 is deposited over the GST plug 18.

In operation, a short electrical pulse is applied through the electrodes 14, 20 to the GST plug 18 to cause a phase-change region 22 to melt. The remainder of the GST plug 18 is preferably always in the conductive crystalline state. Depending on whether the melting pulse is short or long, the phase-change region 22 either quickly cools and quenches to a high-resistance amorphous state or slowly cools to a low-resistance crystalline state. The state of the PCM cell 10 can be read by measuring its resistance between the electrodes 14, 20 across the GST plug.

Switching currents may be reduced by a variation of the structure of FIG. 1 in which a smaller volume of GST is deposited near the bottom of the via 16 and the metal fills the rest of the via and the region 18.

Germanium antimony telluride and other phase-change materials are preferably sputter deposited. However, DC magnetron sputtering of such materials presents particular problems. GST sputtering targets are presently available only in pressed powder form in which separate powders of germanium, antimony, and tellurium are mixed in the desired compositional fractions and pressed together and partially fused to form the target in a process similar to sintering. However, a sintered target is not completely homogeneous. Unusual interactions occur with the inhomogeneities, which may produce arcing. It has become apparent that frequent target cleaning is desirable. Also, the powder target has a low thermal and electrical conductivity. The low thermal conductivity means they need to be relatively thin to provide backside cooling. Improved erosion uniformity in the target is required to lengthen the lifetimes of the thin targets.

In the case of the variation of the PCM structure in which the GST is deposited near the bottom of the high aspect-ratio via, sputtering techniques need to be developed which sputter deep into the geometrically unfavorable high aspect-ratio holes. Such techniques have been developed for sputtering metals such as aluminum, copper, or refractory barrier materials based upon a high fraction of ionized sputtered atoms, but these techniques typically rely upon high power delivered to the target to generate a high density plasma. However, a GST target is somewhat resistive and will overheat if excessive power is applied to it.

Figure 2:
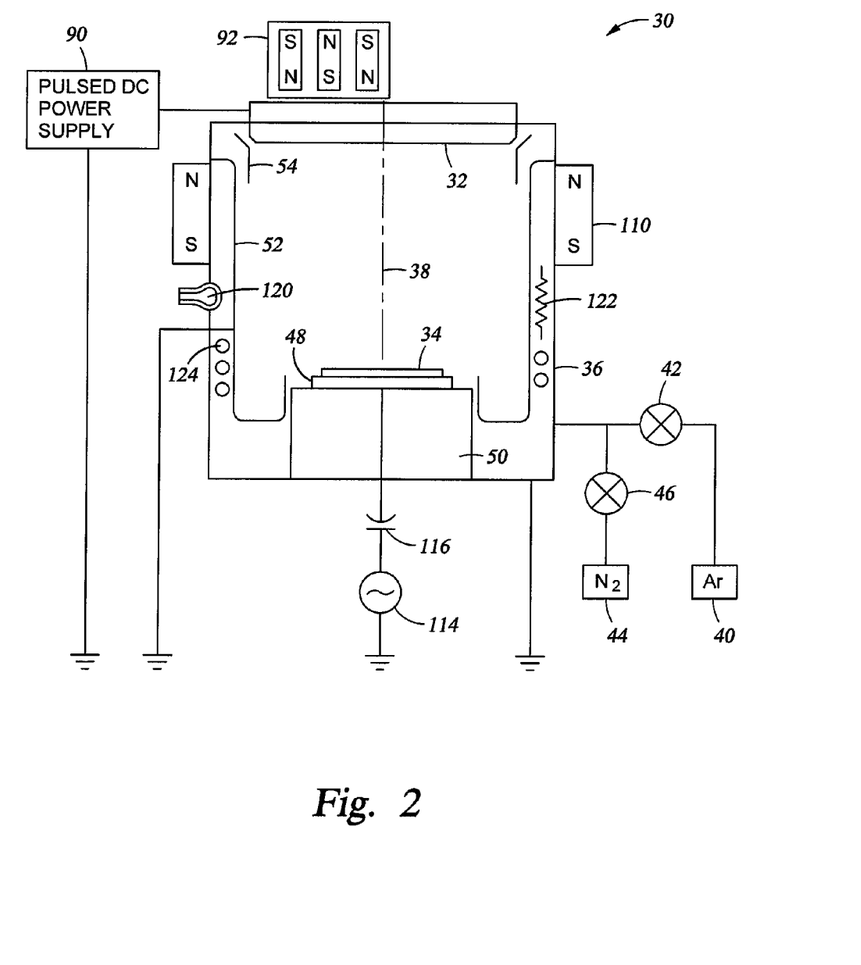
FIG. 2 is a schematic cross-sectional view of plasma sputter chamber usable in practicing the invention.

A plasma sputter chamber 30, illustrated schematically in FIG. 2, has been adapted to sputter GST from a GST target 32 onto a silicon wafer or other substrate 34. The sputter chamber 30 includes a vacuum chamber 36 arranged about a central axis 38. It may be configured for long throw with a target-to-wafer spacing of 290 to 400 mm for a 200 or 300 mm wafer. Other spacings may be used, but generally throws of at least 190 mm are preferred when high aspect-ratio holes need to be filled. The target 32 is supported through an unillustrated isolator on the vacuum chamber 36 and is vacuum sealed to it. An unillustrated vacuum pumping system pumps the vacuum chamber 36 to a base pressure in the microTorr range. However, a sputter working gas, for example, argon, is supplied from an argon gas source 40 through a mass flow controller 42. For reactive sputter deposition, for example, of a nitride such as nitrogen-doped GST, a reactive gas such as nitrogen is supplied from a nitrogen gas source 44 through another mass flow controller 46 into the chamber 36 during plasma sputtering.

The wafer 34 is supported by a holder 48, which may include an electrostatic chuck (ESC) or an edge ring, to both clamp the wafer 34 and to control its temperature. A wafer pedestal 50 may include both a liquid cooling channel and a embedded resistive coil to control its temperature over a wide temperature range of, for example, 0° C. to 450° C. Argon may be supplied for example, at a pressure of 5 to 7 Torr as a thermal transfer gas between the wafer 34 and the holder 48 to promote the transfer of heat between the wafer 34 and the pedestal 50 to provide even temperature across the wafer 14. The sidewalls of the vacuum chamber 36 and the sides of the pedestal 50 are protected by a grounded shield 52 having an annular trough shape. An electrically floating shield 54 protects the very top of the vacuum chamber sidewalls and is adjacent the sides of the target 32 to build up a potential during sputtering and thereby focus the plasma to the middle of the target 32.

Figure 3:
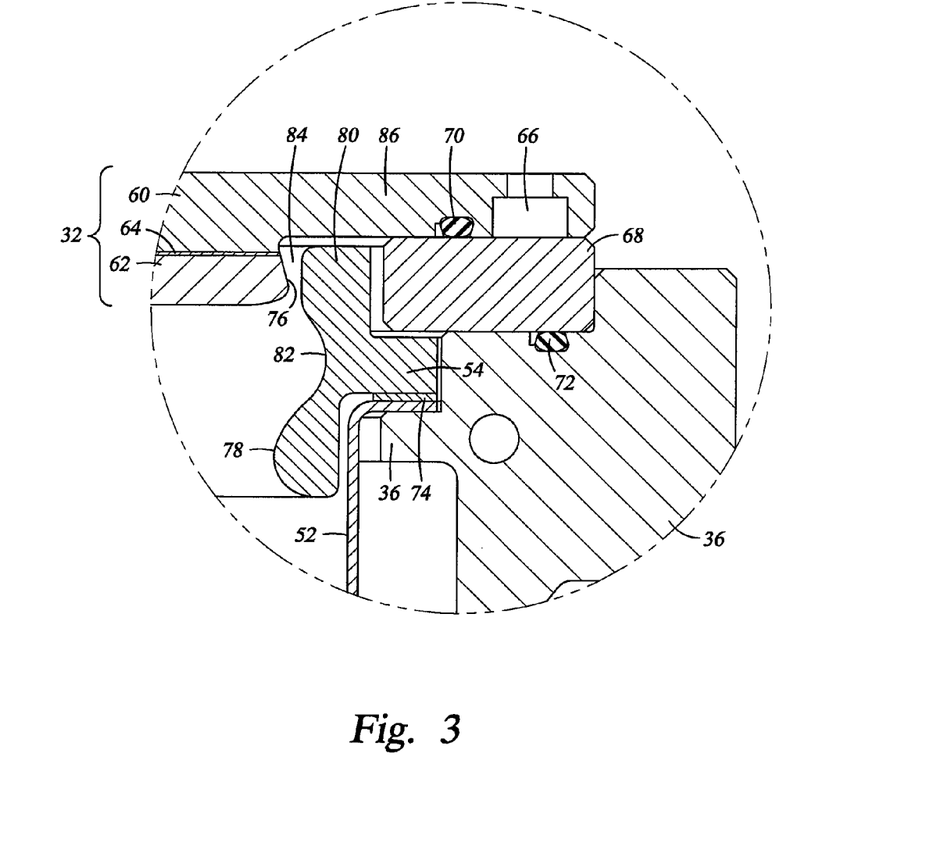
FIG. 3 is exploded cross-sectional view of the target support area of the sputter chamber of FIG. 2.

The details of the target area are illustrated in the blown up sectional view of FIG. 3. The target 32 includes a backing plate 60, for example, of copper to which a target layer 62 of GST is bonded by a bonding layer 64, for example, of indium. The target layer 62 is kept relatively thin, for example, less than ½" (12 mm) or even ¼" (6 mm) because of the poor thermal conductivity of GST. The backing plate 60 is screwed to the cooling back chamber by machine screws in screw holes 66 and is supported on an annular ceramic isolator 68 and sealed to it by an O-ring 70 in an O-ring groove. The isolator 68 in turn is supported on the metallic chamber 36 and sealed to it by another O-ring 72. The grounded shield 52 is supported on the chamber 36 and the floating shield 54 is supported on the grounded shield 52 through a washer-shaped insulator 74.

The design of the sidewalls of the target significantly impacts particle generation during sputtering. Stresses may be induced in the granular GST film and can lead to particle generation due to phase change or thermal stress in the film. A combination of a re-entrant target sidewall and a peanut-shaped floating shield is designed to minimize particle generation. The peripheral edge of the target layer 62 and to a lesser extent corresponding areas of the backing plate 60 are shaped to form a reentrant or concave peripheral side 76. On the sections of the floating shield 54 exposed to the plasma, there are no sharp corners but instead all portions smoothly join together through rounded transitions. The floating shield 54 is formed generally with a peanut shape having a bulbous lower end 78, a generally rectangular upper end 80 and a concave surface 82 between them on the radially inward side. The design of the floating shield 54 increases the surface area of deposition near the target 32 and its gradual curvature (a radius of curvature of no less than 0.12 inch (3 mm) and preferably no less than 0.25 inch (6 mm away from the grounded shield) decreases any stress, whether in tension or compression, that may be trapped in sputtered material. A convolute gap 84 is formed between the rectangular upper end 80 of the floating shield 52 and the reentrant periphery of the target layer 62, the bottom of a flange 86 of the backing plate 60 and the radially inner side of the isolator 68. The thickness of the gap 84 is kept to less than the plasma dark space so that the plasma does not enter the gap 84 and also prevents significant deposition within the gap 84, thereby reducing the production of particles. The re-entrant target sidewall chokes the plasma dark space and makes it difficult to generate a second plasma in the gap 84, thereby preventing particle formation from that source.

Figure 4:
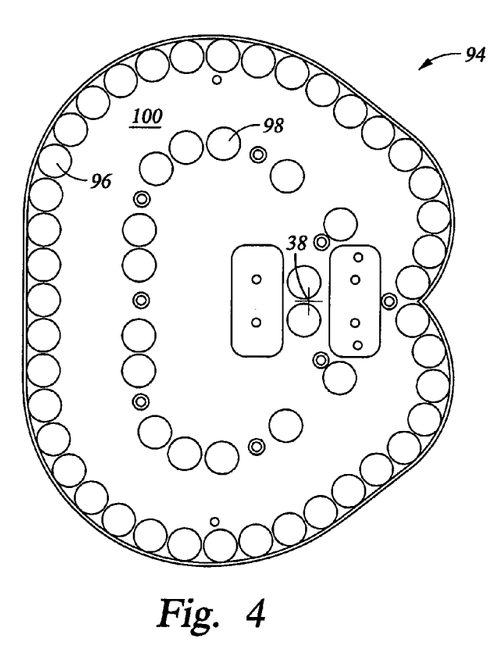
FIG. 4 is a plan view of a magnetrons usable in practicing the invention

Returning to FIG. 2, a pulsed DC power supply 90 applies a predetermined pulse waveform to the target 32 to ignite the argon working gas into a plasma and maintain the plasma. During the sputtering phase of the waveform, the target 32 is biased mostly negatively with respect to the grounded shield 52 and the vacuum chamber 36 and the positive argon ions are accelerated to the target 32 and sputter the GST components of the target layer 62. The plasma adjacent the target 32 is intensified by a magnetron 92 which is positioned in the water cooling bath at the back of the target 32 and rotates about the central axis 38 of the vacuum chamber 36. As an example of the magnetron 92, a butterfly magnetron 94, illustrated in the plan view of FIG. 4, includes a closed outer pole of one magnetic polarity parallel to the central axis 38 and formed by a band of cylindrical magnets 96 placed in one orientation and an inner pole of the opposed magnetic polarity formed by a band of similar cylindrical magnets 98 but placed in the opposed orientation. The outer pole surrounds the inner pole with a closed gap 100 formed between them, which defines a closed plasma track on the sputtering side of the target 32. The butterfly magnetron 94 may include conventional pole faces over the fronts of the respective magnet sets and a magnetic yoke coupling the backs of the two set of magnets 96, 98. The illustrated magnetron has the advantage of sweeping a magnetic field over the center of the target as well as the outer portions more useful for filling deep holes. Thereby, sputtered material redeposited on the target is not allowed to build up to the point that it flakes off to produce particles. Other magnetron may be substituted, for example, the baseline or optimized spiral magnetrons described by Yang et al, in U.S. Pat. No. 7,186,319.

Returning to FIG. 2, side magnets 110 are arranged in an annular pattern near the top of the vacuum chamber sidewall. Although the opposite orientation is possible, it has been found that the polarity of the side magnets 110 is preferably the opposite polarity from that of the outer pole of the magnetron 92 so that the two magnets tend to repel each other. The side magnets 110 may be replaced by a DC electromagnetic coil producing a similar magnetic field inside the vacuum chamber 36.

It is sometimes preferred that the GST deposited on the wafer 14 be nitrogen doped up to about 10 at %. Doping of 2 to 5 at % is more preferred. The doping may be achieved by reactive sputtering in which nitrogen gas is selectively supplied from the nitrogen gas source 44 during plasma sputtering of the GST target 32.

Figure 5:
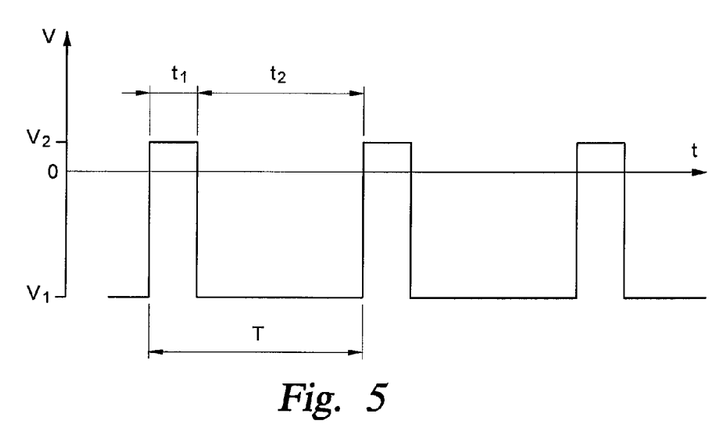
FIG. 5 is a timing chart for an embodiment of the invention including bipolar pulsing of the sputter target.

The form of the electrical waveform which the pulsed DC power supply 90 applies to the target 32 is illustrated in the waveform of FIG. 5. The sputter deposition process occurs over a time period $t_1$ during which the target 32 is held at a negative DC potential $V_1$ in the vicinity of about −200 to −1000 VDC. However, over a time period $t_2$, for example, 3:s, a positive voltage $V_2$ is applied to the target. During this period, the target 32 is being reconditioned instead of being sputtered. The positive voltage repels positive charges that accumulate around dielectric or highly resistive material formed in the target during ion bombardment. Removing the excess charge acts to prevent electrical arcing, a source of particles. The positive voltage $V_2$ may be in the range of 25 to 50 VDC and may be about 10% of the magnitude of $V_1$, for example, in a range of 5 to 25% of *$V_1$*. The average DC target power is about 1.5 kW for a 200 mm wafer chamber having a target with a diameter of about 280 mm but a broader range is 0.5 to 2 kW or even 100 W to 4 kW. A useful upper limit for the average target power density is no more than 4 W/cm$^2$. This power is averaged over the entire target rather than the area of the magnetron, which determines the power density upon which the plasma density more directly depends. The pulsed waveform repeats on a repetition period T corresponding to a frequency of 25 kHz, that is, a period of 40:s, and a duty factor of 3:40 for the reverse pulsing. Other repetition frequencies may be chosen, for example, 5 to 100 kHz or even 350 kHz. These frequencies compare to a magnetron rotation frequency of around 100 Hz. That is, the power waveform pulses many times for each rotation of the magnetron 92.

This waveform has the secondary effect of reducing the average sputtering power applied to the target by a factor of the duty factor, thereby reducing the thermal dissipation requirements. If the duty factor for reverse pulsing is increased further, that is, a larger $t_1/T$ fraction, by increasing the duration of the reverse pulse and/or increasing the pulse frequency, target heating become less of a problem. An RF shielding cover can be employed to prevent RF power from radiating from the target and causing electrical interference.

Once the plasma has been ignited, the argon pressure within the vacuum chamber may be reduced to less than 1 milliTorr, for example, in a range of 0.3 to 0.8 milliTorr, and nonetheless the plasma is maintained adjacent the GST target. Indeed, the argon supply may be discontinued and sputtering continues despite the very low chamber pressure, substantially less than 1 milliTorr, in a process called sustained self-sputtering (SSS) in which the plasma adjacent the target is intense enough that a sufficient number of sputter atoms are ionized that they can be attracted back to the target and resputter the target with a sputtering yield sufficient to continue the process. In the past, GST was not considered to be a material subject to SSS, particularly at the relatively low target power mentioned above. Low-pressure and even SSS sputtering is achievable despite the reverse target biasing for cleaning as long as the reverse time $t_1$ is kept relatively short, for example, less than 10:s, during which time the electrons in the plasma do somewhat diffuse away but the plasma nonetheless persists.

Returning to FIG. 2, although in some applications the wafer 34 may be left electrically floating, in other applications an RF bias supply 114 coupled to an electrode in the holder 48 through a capacitive coupling circuit 116 induces a negative DC self-bias adjacent the wafer 34 to accelerate ionized sputter atoms in the plasma towards the wafer 34. The accelerated ions are effective at filling GST or other metals into holes having a high aspect ratio, that is, narrow and deep holes. The frequency of the RF bias power supply 114 may be 13.56 MHz although 1 or 2 MHz has been used in other applications. A bias power of up to 200 W normalized for a 200 mm wafer, is preferred, and up to 50 to 75 W is more preferred.

Temperature has been found to be an important parameter in determining the crystallographic state of the deposited GST. As a result, the wafer must be closely thermally coupled to the temperature-controlled pedestal, typically by clamping or chucking the wafer to the pedestal and injecting a thermal transfer gas between the wafer and pedestal. For the PCM cell of FIG. 1, it is desired that the plug 16 be filled with GST in crystalline or polycrystalline form. Only during operation, is the phase-change region 20 selectively poled into the amorphous state. There appears to be a phase transition for GST around 105° C., below which the deposited GST film is amorphous and resistive but above which it is polycrystalline and conductive or at least less resistive. It is noted that in-situ and ex-situ transition temperatures may differ. We found that film deposited with in-situ heating temperature of at least 110° C. tends to form in a polycrystalline phase while amorphous film subject to ex-situ heating of at least 150° C. after deposition changes to the polycrystalline phase. Typically, ex-situ heating and cooling are involved in memory operations, both reading and writing, whereas the in-situ heating discussed in this patent refers to the process parameter employed for film deposition. The in-situ transition temperature is not an intrinsic material property of the film. Rather it depends on the deposition method used, both hardware and process conditions, as well as the intrinsic material properties. Our tests show that the in-situ transition temperature under one set of deposition conditions is in the range of 100 to 116° C. In contrast, ex situ annealing after deposition generally requires a temperature of 150° C. for crystallization into the face-centered cubic (fcc) phase and 200° C. for the more stable hexagonal phase.

Figure 6:
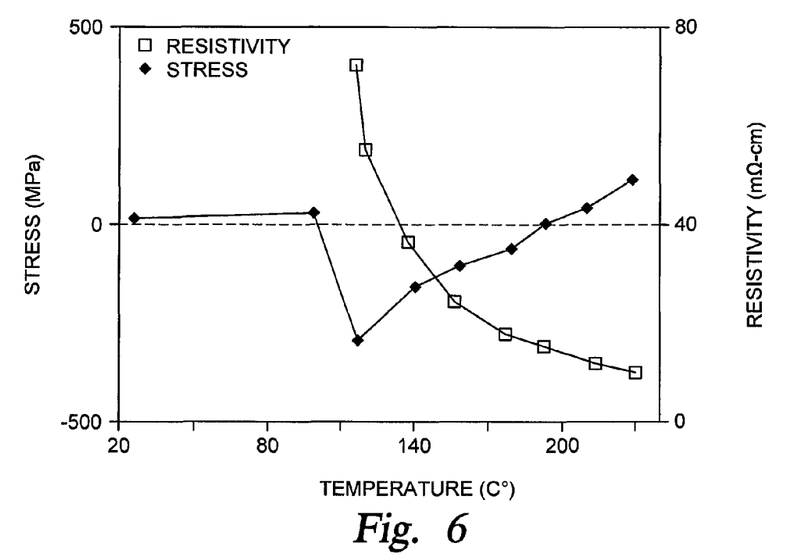
FIG. 6 is a graph illustrating the observed dependence of resistivity and stress upon deposition temperature of a film of germanium antimony telluride.

In order to promote the deposition of amorphous GST, it is preferred that the pedestal 50 be kept at a temperature of less than 100° C. and that the thermal transfer gas couple this temperature to the wafer 34. On the other hand, in order to promote deposition of crystalline GST, the pedestal 50 should be kept at a temperature of greater than 105° C. and preferably above 120° C. to assure full fcc crystallization. Examples of successfully practiced heater temperatures for the two states are 25° C. for the amorphous film and 140° C. and 235° C. for the polycrystalline film. In each case, an electrostatic chuck and thermal transfer gas between the heater and wafer advantageously promote a uniform temperature across the wafer, which has been found to be important for achieving consistent and repeatable film properties across the wafer and from wafer to wafer. As illustrated in the graph of FIG. 6, in the crystalline regime, the GST resistivity is observed to decrease from 76 to 9 milliohm-cm as the chuck temperature increases from 120 to 235° C. Also, the uniformity of sheet resistance improves with increasing chuck temperature.

Figure 7:
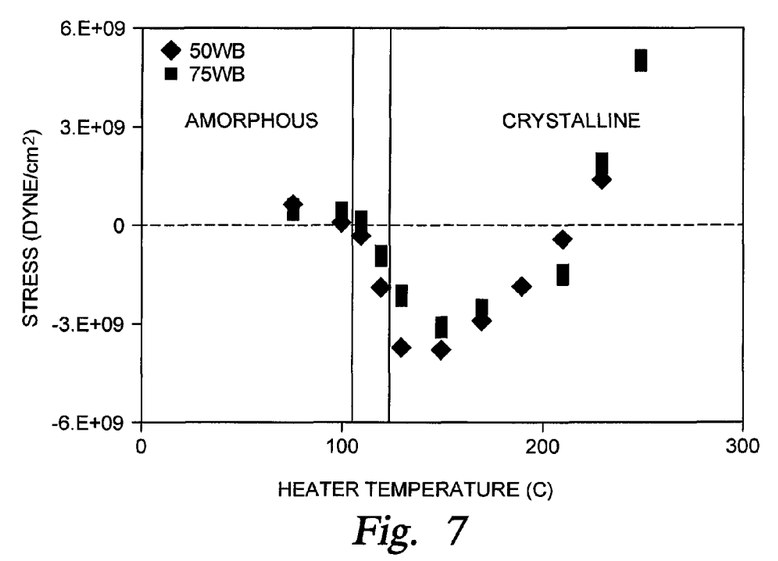
FIG. 7 is a graph illustrating the observed dependence of stress upon deposition temperature and bias power.

The pedestal temperature also affects the stress induced in the deposited GST, as illustrated in the graphs of FIGS. 6 and 7. The two sets of data in FIG. 7 were derived from two sets of samples sputter coated at two different values of the bias power of 50 and 75 W for a 200 mm wafer. The middle band in FIG. 7 shows a somewhat broad transition in the range of about 100 to 120° C. between amorphous and crystalline states. A mid value of perhaps 115° C. may be used to separate the two states. But a more conservative interpretation is that temperatures below 100° C. should be used to form the amorphous state and temperatures above 120° C. should be used to form the crystalline state. In the typical preferred situation of minimum stress, the amorphous GST should be deposited at a wafer temperature of less than 100° C. while crystalline GST is preferably deposited at a wafer temperature in a range of about 175 to 225° C. However, some device integration processes may require compressive stress be present in the crystalline GST film, which can be obtained at intermediate temperatures (120 to 180° C.), yet some other device integration processes may require tensile stresses that can be obtained with chuck temperatures of above 210° C. The deposition temperature also affects the density of the deposited film.

The amorphous GST deposited below 100° C. exhibits tensile strain but crystalline GST shows a maximum compressive strain just above the transition temperature. The compressive strain decreases with increasing chuck temperature and changes to tensile strain at about 190° C.

Figure 8:
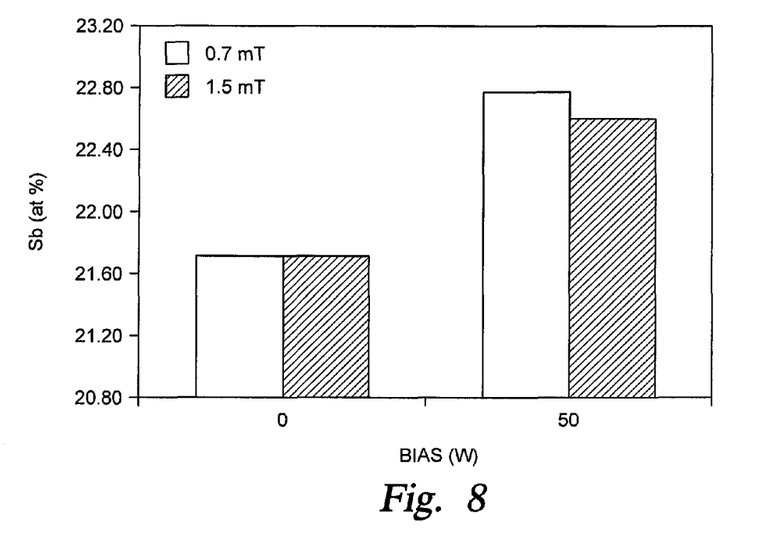
FIGS. 8 and 9 are bar charts illustrating the observed dependence of antimony and tellurium fraction upon bias power and chamber pressure.
Figure 9:
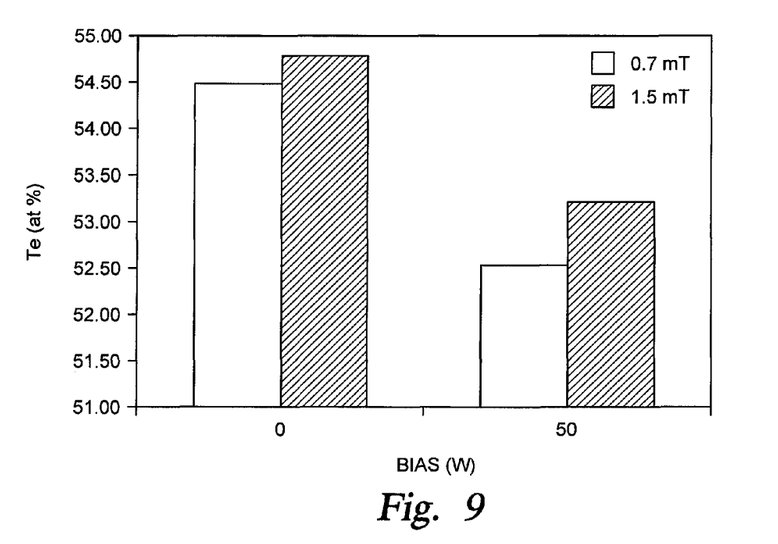
Figure 10:
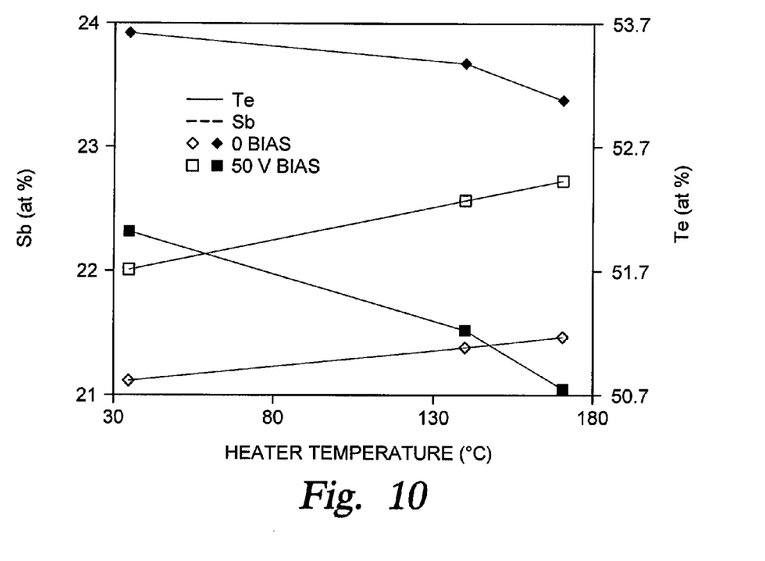
FIG. 10 is a chart illustrating the antimony and tellurium concentrations as a function of heater temperature for different biases.

Chamber pressure and wafer bias have been observed to affect the antimony and tellurium fractions in the deposited film sputtered from a target of fixed composition, as illustrated in the bar charts of FIGS. 8 and 9. The antimony concentration increases with wafer bias and the increases is slightly larger for the lower pressure of 0.7 milliTorr. On the contrary, the tellurium concentration decreases with wafer bias and lower pressure tend to further reduce the tellurium concentration. The compositional dependence upon bias may arise from tellurium having the highest resputtering yield of the three GST components. As shown in the graph of FIG. 10, high wafer temperatures also reduce the tellurium concentration.

Sputtering into the low aspect-ratio plug 18 of FIG. 1 does not present serious problems but sputtering into the bottom of the high aspect-ratio via 16 in the improved low-current PCM structure presents serious problems in step coverage. As noted before, the resistive target preferably should be powered to no more than 4 W/cm$^2$, about an order of magnitude less than the power densities used for ionized sputtering of metals into deep vias. However, low-pressure sputtering or sustained self-sputtering increases the ionization fraction reaching the wafer. Furthermore, the use of sidewall magnets creates a magnetic barrier and focuses the plasma towards the center and thus increase its density. Also, wafer biasing accelerates ions of GST atoms deep within the vias. These two techniques may be used separately or in combination.

The temperature dependence of the crystalline phase of deposited GST must also be considered for the shields 52, 54. They are intended to be coated with sputtered material rather than sidewalls of the vacuum chamber 36 and to be periodically replaced without the need to clean the inside of the chamber itself. However, if they are maintained at low temperature below 100° C., GST deposits on them in the highly resistive amorphous state. The grounded shield 36 is intended to act as the electrical anode for the sputtering process and hence is subjected to plasma heating. A dielectric GST coating on the grounded shield 52 will cause a charge to build up on the resistive GST and to prevent current sinking and thus to hinder the plasma generation.

Two different and combinable approaches prevent the deposition of amorphous GST on the grounded shield 52. In a first approach, the temperature of the grounded shield 52 may be heated during sputtering, for example, by an annular radiant heater 120 or an annular resistive heater 122 to an elevated temperature well above the transition temperature of GST between its amorphous and crystalline states, for example, above 120° C. or preferably above 235° C. and possibly at higher temperatures up to 400° C. However, it may instead be required to cool the grounded shield 52 by a cooling water coil 124 wrapped around the shield 52. In a second approach, the grounded shield 52 is pre-coated on its inner side at least with a layer of material that promotes the formation of GST in its crystalline face-centered cubic (fcc) form having a lattice constant of 0.6 nm or hexagonal close packed (HDP) form. A thin aluminum or copper coating provides the desired crystallographic templating. As a result, the GST deposited on the shield forms in the conductive crystalline form and the shield continues to present a grounding plane to the plasma.

It is also desired that both the grounded shield 52 and the floating shield 54, typically formed of stainless steel, be pre-coated with arc sprayed aluminum to increase their surface roughness and thus increase the adhesion of the GST deposited on them, thereby reducing the production of particulates of the deposited GST material. A typical method of arc spraying aluminum involves a twin-wire arc-spraying process.

Optionally, a shutter disk may be employed for target cleaning prior to film deposition, target burning, or chamber conditioning. A shadow ring may be employed to prevent film deposition on the wafer edge or exclusion zone to meet certain integration requirements.

The invention thus allows the economical deposition by DC magnetron sputtering of metal chalcogenides such as germanium antimony telluride, which are particularly useful for phase change memories.

The invention claimed is:

1. A method of sputtering a material comprising a metal chalcogenide capable of forming in a crystalline form and an amorphous form, comprising:
   magnetron sputtering a target comprising the metal chalcogenide; and
   maintaining a temperature of a substrate containing a hole in a dielectric layer and disposed in opposition to the target at a selected temperature above a minimum temperature such that the metal chalcogenide deposits within the hole in crystalline form.

2. The method of claim 1, wherein the metal chalcogenide comprises germanium antimony telluride.

3. The method of claim 2, wherein the minimum temperature is 100° C.

4. The method of claim 3, wherein the selected temperature is above 120° C.

5. The method of claim 4, wherein the selected temperature is above 140° C. and below 350° C.

6. The method of claim 1, wherein the substrate temperature is controlled by use of a thermal transfer gas supplied to an area between the substrate and a temperature-controlled substrate support and means for holding the substrate against the substrate support.

7. The method of claim 1, further comprising:
   rotating a magnetron to pass over a center of the target
   applying DC power of no more than 4 W/cm$^2$ to the target; and
   at least one of
      applying from a sidewall of the chamber supporting the target a magnetic field having components along a central axis of the chamber, or
      RF biasing an electrode supporting the substrate through a capacitive coupling circuit.

8. The method of claim 7, including both the applying and the RF biasing steps.

9. The method of claim 2, further comprising:
   rotating a magnetron to pass over a center of the target
   applying DC power of no more than 4 W/cm$^2$ to the target; and
   at least one of
      applying from a sidewall of the chamber supporting the target a magnetic field having components along a central axis of the chamber, or
      RF biasing an electrode supporting the substrate through a capacitive coupling circuit;
   exciting a plasma in a plasma chamber including the magnetron disposed in back of the target comprising the metal chalcogenide; and
   after the plasma has been excited, reducing a pressure in the chamber to no more than 0.8 milliTorr to effect at least partial self-sustained sputtering of the target.

10. The method of claim 1, comprising applying to the target a repetitive pulse form having a repetition frequency of between 10 and 350 kHz and having a positive portion of a duration less than that of a negative portion.

11. The method of claim 10, wherein the positive portion has a pulse width of no greater than 10 microseconds.

12. The method of claim 10, wherein the positive portion has a magnitude less than a magnitude of the negative portion.

13. A method of plasma sputtering a target comprising a metal chalcogenide capable of forming either an amorphous or a crystalline phase of a material of the target on a substrate, comprising:
   maintaining a temperature of a shield in the sputtering chamber to a temperature at which the crystalline and not the amorphous phase forms on the shield by coupling a heat source to the shield during the plasma sputtering of the target.

14. The method of claim 13, wherein the temperature of the shield is at least 105° C.

15. The method of claim 1, wherein the metal chalcogenide deposited within the hole is electrically connected to an electrode underlying the hole.

16. The method of claim 1, wherein metal chalcogenide would deposit within the hole in an amorphous form if the substrate were held at a selected temperature less than the minimum temperature.

17. The method of claim 13, wherein the metal chalcogenide comprises germanium antimony telluride.

* * * * *